(12) United States Patent
Nagaoka

(10) Patent No.: US 6,396,123 B1
(45) Date of Patent: May 28, 2002

(54) SEMICONDUCTOR DEVICE PROVIDED WITH ON-CHIP DECOUPLING CONDENSER UTILIZING CMP DUMMY PATTERNS

(75) Inventor: Hideaki Nagaoka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/548,617

(22) Filed: Apr. 13, 2000

(30) Foreign Application Priority Data

Oct. 15, 1999 (JP) .............................. 11-293682

(51) Int. Cl.[7] .............................................. H01L 29/00
(52) U.S. Cl. ...................... 257/532; 257/533; 257/534; 257/535
(58) Field of Search .................. 257/532–535, 257/202, 204–208, 210, 211, 288, 368; 438/957

(56) References Cited

U.S. PATENT DOCUMENTS 5,307,309 A * 4/1994 Protigal et al. ............... 365/63

FOREIGN PATENT DOCUMENTS

| GB | 2268829 A | * 1/1994 | .................. 257/532 |
| JP | 60-206161 | 10/1985 | |
| JP | 1-112765 | 5/1989 | |
| JP | 1-304762 | 12/1989 | |

* cited by examiner

Primary Examiner—Minh Loan Tran
Assistant Examiner—Thomas L. Dickey
(74) Attorney, Agent, or Firm—McDermott, Will & Emery

(57) ABSTRACT

A dummy pattern for use in a chemical mechanical polishing (CMP) process is disposed in a field dummy region within a p⁻ well region, isolated by an isolating insulating film, wherein the p⁻ well region has a potential fixed by a ground electrode. The dummy pattern includes a gate insulating film dummy pattern and a gate electrode dummy pattern, formed in the same layers as a gate insulating film and a gate electrode, respectively, of an NMOS transistor. The gate electrode dummy pattern is connected with a contact plug, which in turn is connected with a power supply electrode (Vcc) interconnection line. Thus, a decoupling condenser, formed of the field dummy region within the p⁻ well, the gate insulating film dummy pattern and the gate electrode dummy pattern by utilizing the dummy patterns for use in the CMP process, is connected in parallel with a primary electronic circuit. As a result, a semiconductor device is obtained which operates at a low voltage with suppressed electromagnetic interference (EMI), without increasing an area occupied by the semiconductor device.

6 Claims, 17 Drawing Sheets

SEMICONDUCTOR DEVICE PROVIDED WITH ON-CHIP DECOUPLING CONDENSER UTILIZING CMP DUMMY PATTERNS

BACKGROUND OF THE INVENTION

1. Field of the Invention

The present invention relates to a semiconductor device having a decoupling condenser.

2. Description of the Background Art

As one way to miniaturize semiconductor devices, a technique called "chemical mechanical polishing" (hereinafter, referred to as "CMP") has conventionally been employed. In the CMP process, a surface of an interlayer insulating film or the like on a semiconductor substrate is polished for planarization to improve precision in photolithography in a subsequent process. This technique, however, has the following disadvantages. The surface of the interlayer insulating film may be polished excessively over an area where pattern density of gate electrodes or the like within the semiconductor chip is sparse, whereas it may be polished unsatisfactorily over an area with high pattern density. This creates an asperity on the surface of the interlayer insulating film. To prevent such an asperity, the variation in the pattern density of gate electrodes or the like to be formed on the semiconductor substrate should be reduced. To this effect, the area with sparse pattern density has been provided with dummy patterns, e.g., dummy gate electrodes, that are unnecessary for a circuit operation.

A structure of a semiconductor device having dummy patterns for use in the conventional CMP process will now be described with reference to FIGS. 16 to 19. As shown in FIGS. 17 and 19, a p$^-$ well 123 and an n$^-$ well 119 are formed below a main surface of a semiconductor substrate with a prescribed depth. In respective regions of p$^-$ well 123 and n$^-$ well 119, as shown in FIGS. 16 and 18, element forming regions are formed, separated from one another by an isolating insulating film 135. P$^+$ and n$^+$ impurity regions are formed in the element forming regions.

The p$^+$ and n$^+$ impurity regions in p$^-$ well 123 and n$^-$ well 119 are connected with contact plugs 140 and 145, respectively. Contact plugs 140 are connected with a ground electrode (GND) interconnection line 114, and thus, p$^-$ well 123 has a potential fixed by the ground electrode. Contact plugs 145 are connected with a power supply electrode (Vcc) interconnection line 113, whereby n$^-$ well 119 has a potential fixed by the power supply electrode. In prescribed regions where the surfaces of p$^-$ well 123 and n$^-$ well 119 are exposed, gate insulating film dummy patterns 121a and 129a are formed, respectively, in the same layer as gate insulating films 121 and 129. Gate electrode dummy patterns 131a and 139a are formed in the same layer as gate electrodes 131 and 139.

In the semiconductor device having dummy patterns formed for use in the above-described conventional CMP process, gate electrode dummy patterns 131a and 139a formed in the gate electrode forming process are stacked on top of gate insulating film dummy patterns 121a and 129a formed in the gate insulating film forming process, respectively, as shown in FIGS. 16 and 17. Here, the gate electrode dummy patterns, which are floating conductive layers, induce parasitic capacitance, for which no countermeasures are taken. To lessen the adverse effects that such uncontrolled parasitic capacitance because of the floating conductive layers would pose on the electronic circuit, gate electrode dummy patterns 131a, 139a are disposed on isolating insulating film 135 in some cases, as shown in FIGS. 18 and 19.

FIG. 20 is a general equivalent circuit diagram of the conventional semiconductor device as described above. As shown in FIG. 20, the conventional semiconductor device has a circuit configuration in which elements are successively connected as follows. An external power supply electrode (Vcc) interconnection line 101 is connected to a power supply electrode (Vcc) pin 102. Power supply electrode (Vcc) pin 102 is connected to a power supply electrode (Vcc) pad 103. An external ground electrode (GND) interconnection line 104 is connected to a ground electrode (GND) pin 105. Ground electrode (GND) pin 105 is connected to a ground electrode (GND) pad 106. Electronic circuits 108 are connected in parallel with each other between power supply electrode (Vcc) pad 103 and ground electrode (GND) pad 106.

A parasitic inductance 120 of power supplying lead frame is formed between external power supply electrode (Vcc) interconnection line 101 and power supply electrode (Vcc) pin 102, and also between external ground electrode (GND) interconnection line 104 and ground electrode (GND) pin 105. A parasitic inductance 130 of bonding wire is formed between power supply electrode (Vcc) pin 102 and power supply electrode (Vcc) pad 103 and also between ground electrode (GND) pin 105 and ground electrode (GND) pad 106. Parasitic resistances 107 are formed on interconnection lines connecting power supply electrode (Vcc) pad 103 and electronic circuits 108, and on interconnection lines connecting ground electrode (GND) pad 106 and electronic circuits 108.

In the conventional semiconductor device as described above, electric fields are generated in parasitic inductance 120 of the lead frame and in parasitic inductance 130 of the bonding wire, in a direction to prevent an abrupt change of current. Therefore, there occur a drop of the potential of power supply electrode (Vcc) pad 103, and an increase of the potential of ground electrode (GND) pad 106, as expressed by the following equation (1).

$$\Delta V \times L = dI/dt \tag{1}$$

wherein $\Delta V$ is a potential difference;
L is an inductance;
I is a current; and
t is a time.

There also occur local potential drop and increase within the semiconductor chip due to the parasitic resistance, as expressed by the following equation (2).

$$\Delta V = I \times R \tag{2}$$

wherein $\Delta V$ is a potential difference;
I is a current; and
R is a resistance.

The operating voltage of the semiconductor device should be set taking into consideration the potential drop in power supply electrode (Vcc) pad 103 and the potential increase in ground electrode (GND) pad 106 as described above. This hinders reduction of the operating voltage of the semiconductor device.

Furthermore, noise is generated due to the abrupt change in the current flowing from one circuit to another circuit via the power supplying lead frame and the bonding wire, as expressed by equation (1). This causes electromagnetic waves to be emitted outwards from the semiconductor device. Such electromagnetic waves induce electromagnetic interference (EMI) in neighboring components of the semiconductor device.

One way of suppressing the local potential drop and increase within the circuits as well as the EMI between the semiconductor device and its neighboring components as described above is to provide the semiconductor device with a decoupling condenser. Providing a region dedicated to the decoupling condenser, however, will lead to an increase in an area required for the semiconductor device.

SUMMARY OF THE INVENTION

An object of the present invention is to provide a semiconductor device operable under a low voltage with suppressed EMI, by utilizing dummy patterns used in the above-described CMP process, without increasing the area occupied by the semiconductor device.

The semiconductor device according to the present invention is a semiconductor device having an electronic circuit and a decoupling condenser provided in parallel with each other between a power supply electrode and a ground electrode, wherein the electronic circuit includes a transistor. The decoupling condenser includes: an impurity region formed below a main surface of a semiconductor substrate with a prescribed depth; a dummy gate insulating film located on the impurity region, formed in the same layer as a gate insulating film of the transistor; and a dummy gate electrode located on the dummy gate insulating film, formed in the same layer as a gate electrode of the transistor.

According to the structure as described above, the decoupling condenser is formed in parallel with the electronic circuit having the transistor. Therefore, the electronic circuit having the transistor can be charged instantly with the charges stored in the decoupling condenser when the power supply potential drops or the ground potential increases due to a switching operation of a neighboring electronic circuit. This can suppress generation of power supply noise that would pose adverse effects on the electronic circuit having the transistor. Accordingly, malfunction of the electronic circuit can be prevented even when the operating voltage is set small. As a result, it is possible to decrease the lower limit of the operating voltage of the semiconductor device.

It is also possible to enclose any abrupt current change within the power supply line of each electronic circuit. Therefore, it is possible to avoid an event in which a noise generated in one electronic circuit enters another electronic circuit via the bonding wire connecting the electrode pad and the power supply electrode pin. In other words, a large current change in the power supplying system can be suppressed. This leads to reduction in electromagnetic waves emitted outwards from the semiconductor device, and as a result, EMI in the neighboring components of the semiconductor device is suppressed.

Moreover, according to the structure as described above, the decoupling condenser is formed with a dummy gate insulating film and a dummy gate electrode which are dummy patterns for use in the CMP process formed in the same layers as a gate insulating film and a gate electrode, respectively. Normally, the dummy gate insulating film and the dummy gate electrode are disposed thoroughly in regions on the semiconductor substrate where no gate electrodes are formed, such that the surface of the interlayer insulating film can be planarized in the CMP process therefor. This means that the decoupling condenser can be formed without occupying a special region dedicated thereto on the semiconductor substrate. As a result, it becomes possible to prevent the malfunction under a low voltage as well as the EMI, while reducing an area occupied by the semiconductor device.

Preferably, in the semiconductor device according to the present invention, the ground electrode includes a first ground electrode pad connected to a prescribed analog circuit and a second ground electrode pad connected to an electronic circuit other than the prescribed analog circuit, and the power supply electrode includes a first power supply electrode pad connected to the prescribed analog circuit and a second power supply electrode pad connected to the electronic circuit other than the prescribed analog circuit.

With the structure as described above, a prescribed analog circuit and an electronic circuit other than the prescribed analog circuit are separated from each other in parallel, from their power supply electrode pads to their ground electrode pads. Therefore, when the power supply potential drops or the ground potential rises, noise generated will be transmitted both ways between the prescribed analog circuit and the electronic circuit other than the prescribed analog circuit via parasitic inductance of the bonding wire, i.e., via parasitic inductance of the bonding wire connecting the power supply electrode pad and a power supply electrode pin provided outside of the power supply electrode pad, and via parasitic inductance of the bonding wire connecting the ground electrode pad and a ground electrode pin provided outside of the ground electrode pad.

Such parasitic inductance suppresses an abrupt change in the current. Therefore, the noise generated in an electronic circuit other than the prescribed analog circuit is prevented from being transmitted to the analog circuit, in which such a noise would normally cause malfunction. In other words, the noise can be enclosed within the electronic circuit other than the prescribed analog circuit more effectively. As a result, the malfunction of the prescribed analog circuit affected by the noise generated in the electronic circuit other than the prescribed analog circuit can be prevented more reliably.

More preferably, in the semiconductor device according to the present invention, the ground electrode includes a first ground electrode pin connected to the first ground electrode pad and a second ground electrode pin connected to the second ground electrode pad, and the power supply electrode includes a first power supply electrode pin connected to the first power supply electrode pad and a second power supply electrode pin connected to the second power supply electrode pad.

With such a structure, a prescribed analog circuit and an electronic circuit other than the prescribed analog circuit are separated from each other in parallel, from the power supply electrode pins to the ground electrode pins. Therefore, there exist parasitic inductances of the bonding wire between the power supply electrode pad and the power supply electrode pin and between the ground electrode pad and the ground electrode pin in each of the prescribed analog circuit and the electronic circuit other than the prescribed analog circuit, and there also exists parasitic inductance of the lead frame outside of each of the power supply electrode pin and the ground electrode pin. Thus, the noise generated in the electronic circuit other than the prescribed analog circuit passes through two inductances, i.e., the parasitic inductance of the bonding wire and the parasitic inductance of the lead frame. As a result, enclosure of the noise can further be assured. In other words, when the power supply potential drops or the ground potential increases, the transmission of the noise generated in the electronic circuit other than the prescribed analog circuit to the prescribed analog circuit can be prevented with additional reliability.

In the semiconductor device according to the present invention, the impurity region may be a p type impurity region electrically connected to the ground electrode, and the dummy gate electrode may be electrically connected to the power supply electrode.

Further, in the semiconductor device according to the present invention, the impurity region may be an n type impurity region electrically connected to the power supply electrode, and the dummy gate electrode may be electrically connected to the ground electrode.

More preferably, in the semiconductor device according to the present invention, the impurity region includes an element forming region isolated by an element isolating region, and a field dummy region being a dummy pattern of the element forming region, wherein a semiconductor element is formed in the element forming region, and the dummy gate insulating film and the dummy gate electrode are formed in the field dummy region.

With such a structure, the element forming region in which the semiconductor element is to be formed and the field dummy region which is to be one electrode of the decoupling condenser are formed in one impurity region. Accordingly, two connections, i.e., the connection between the one electrode of the decoupling condenser and the ground or power supply electrode, and the connection between the ground or power supply electrode and a well for fixing the potential so as to stabilize the operation of the semiconductor element, can be realized simply by connecting one contact plug with one impurity region. As a result, in a region proximate to the decoupling condenser, it is only necessary to form either an interconnection line for connection of the dummy gate electrode of the decoupling condenser with the ground electrode, or an interconnection line for connection of the dummy gate electrode of the decoupling condenser with the power supply electrode. This increases the degree of freedom in layout design. As a result, it is possible to reduce the layout area of the semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

First Embodiment

Figure 1:
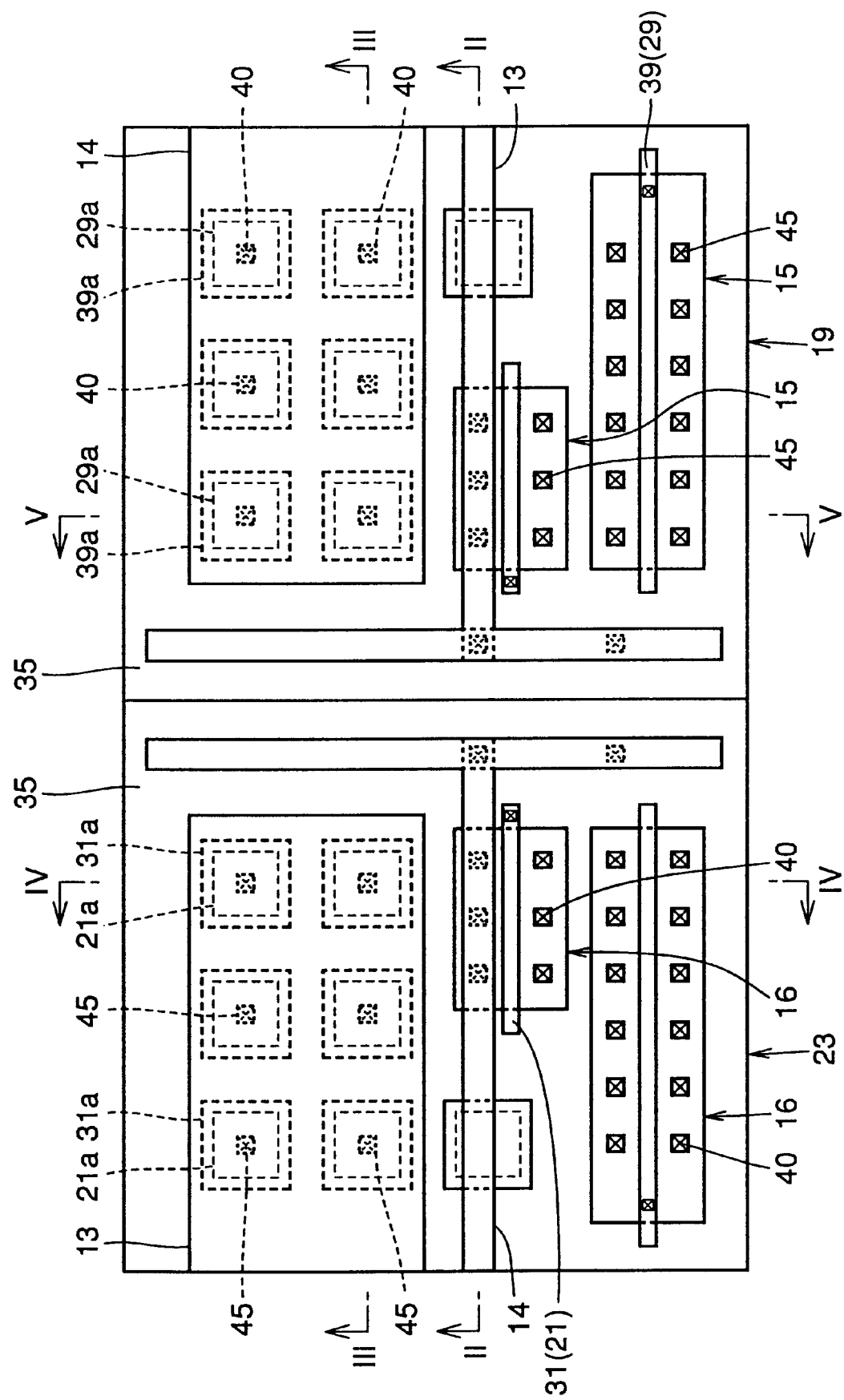
FIG. 1 is a diagram schematically showing a planar structure of a semiconductor device according to a first embodiment of the present invention.

Firstly, the semiconductor device according to the first embodiment of the present invention will be described with reference to FIGS. 1 to 6. The structure of the semiconductor device employing CMP dummy patterns of the present embodiment will be described using FIGS. 1 to 5. As shown in FIGS. 2 to 5, a $p^-$ well 23 and an $n^-$ well 19 are formed below a main surface of a semiconductor substrate with a prescribed depth. In the regions of $p^-$ well 23 and $n^-$ well 19, element forming regions and field dummy regions being dummy patterns of the element forming regions are formed, isolated from one another by an isolating insulating film 35, as shown in FIG. 1. $P^+$ and $n^+$ impurity regions are formed in the element forming regions in $p^-$ well 23 and $n^-$ well 19.

Figure 2:
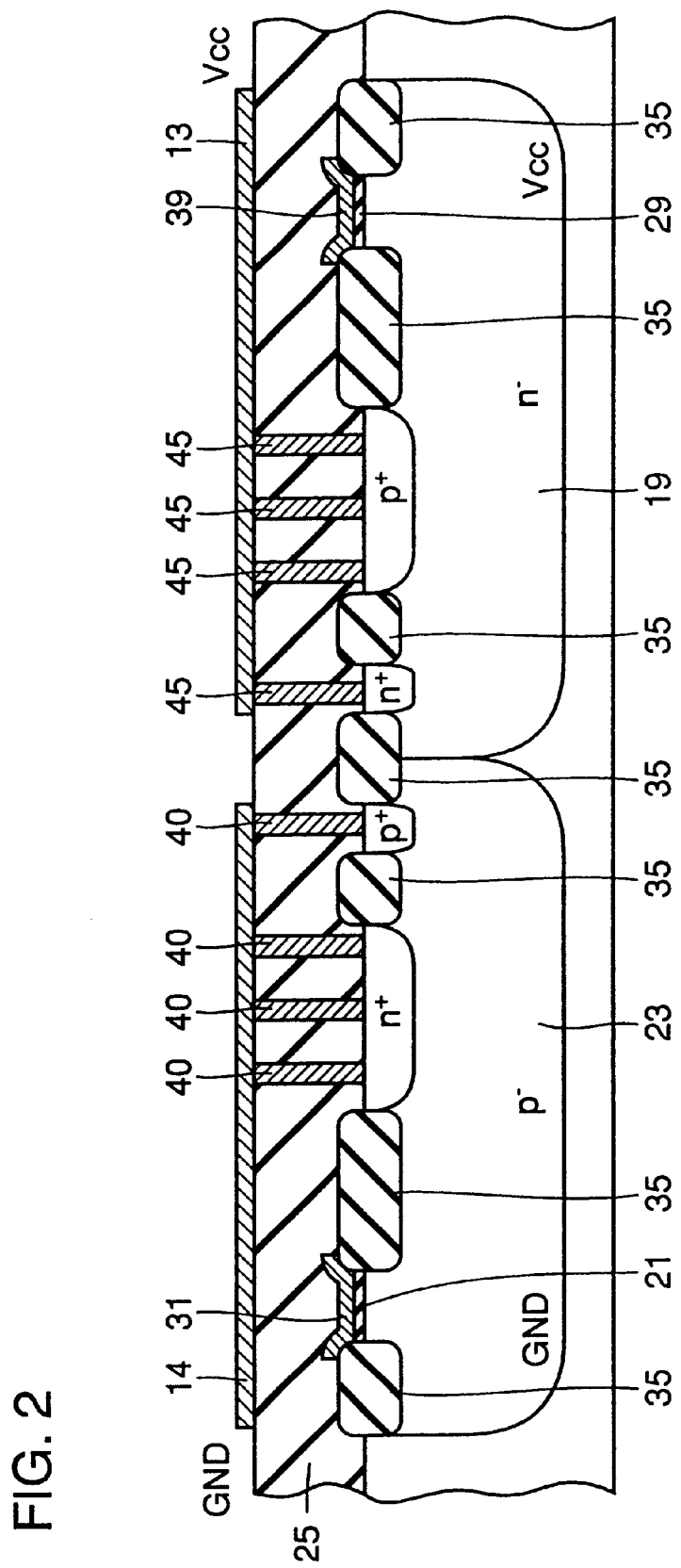
FIG. 2 is a cross sectional view taken along the line II—II in FIG. 1.

As shown in FIG. 2, the $p^+$ and $n^+$ impurity regions in $p^-$ well 23 and $n^{31}$ well 19 are connected with contact plugs 40 and 45, respectively. Contact plug 40 is connected with a ground electrode (GND) interconnection line 14. Contact plug 45 is connected with a power supply electrode (Vcc) interconnection line 13. Further, as shown in FIG. 1, an NMOS transistor 16 and a PMOS transistor 15 are formed in the respective element forming regions in $p^-$ well 23 and $n^-$ well 19.

Figure 3:
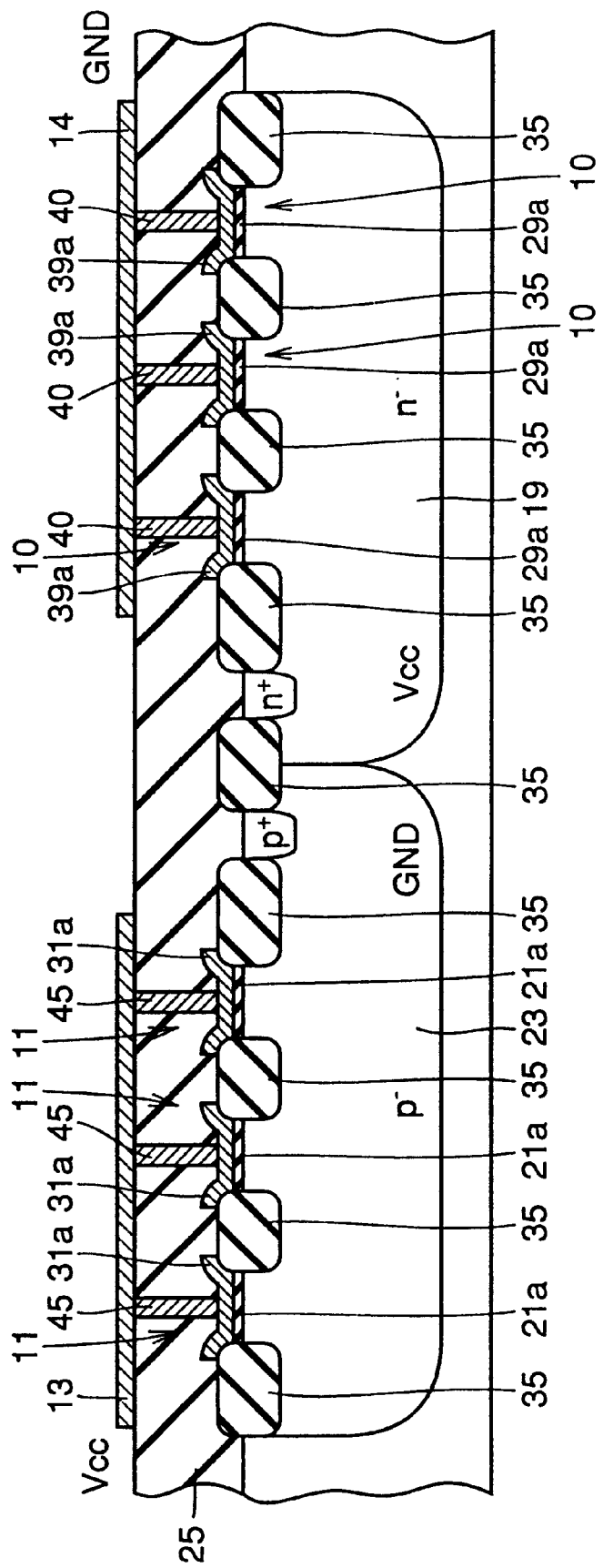
FIG. 3 is a cross sectional view taken along the line III—III in FIG. 1.
Figure 4:
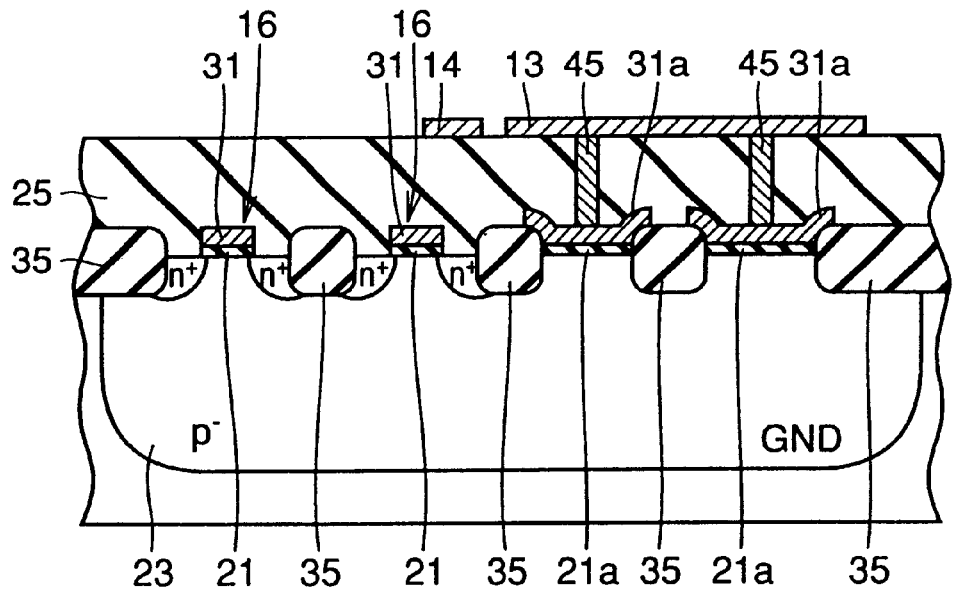
FIG. 4 is a cross sectional view taken along the line IV—IV in FIG. 1.

To form the NMOS transistor 16, a gate electrode 31 is formed on the surface of p⁻ well 23 with a gate insulating film 21 interposed therebetween, as shown in FIG. 4. Of regions on the surface of the semiconductor substrate where p⁻ well 23 is exposed, in a prescribed region where no transistor is formed, i.e., in a prescribed field dummy region, a gate insulating film dummy pattern 21a is formed for the CMP process, in the same layer as gate insulating film 21. A gate electrode dummy pattern 31a for the CMP process is formed in the same layer as gate electrode 31, with the gate insulating film dummy pattern 21a interposed therebetween. Gate electrode dummy pattern 31a is connected with contact plug 45, as shown in FIGS. 3 and 4. Contact plug 45 is connected with power supply electrode (Vcc) interconnection line 13. Thus, a decoupling condenser is formed of p⁻ well 23 including the prescribed field dummy region, gate insulating film dummy pattern 21a and gate electrode dummy pattern 31a. The decoupling condenser is connected in parallel with a primary electronic circuit.

Figure 5:
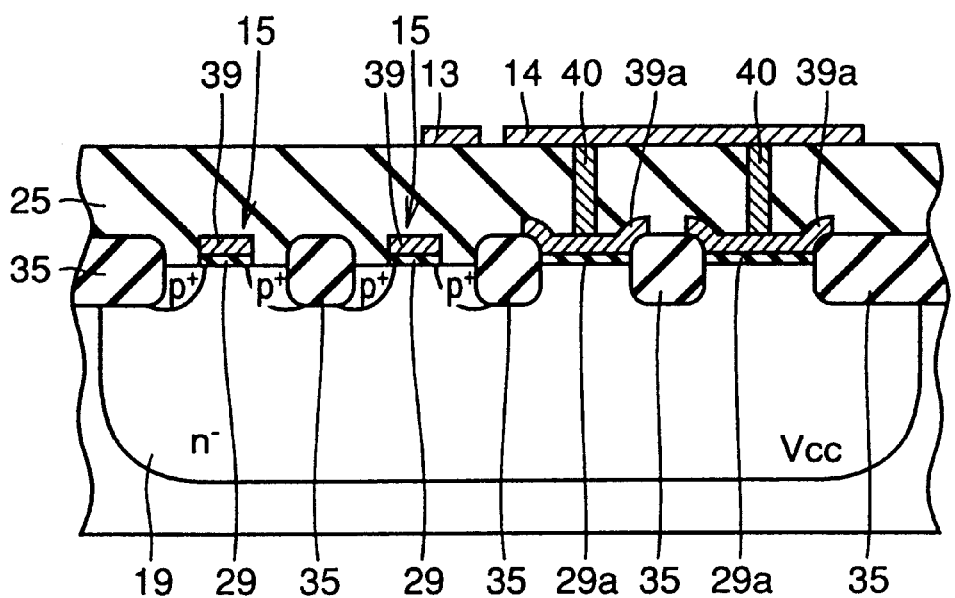
FIG. 5 is a cross sectional view taken along the line V—V in FIG. 1.

Similarly, as shown in FIG. 5, a gate electrode 39 is formed on the surface of n⁻ well 19 with a gate insulating film 29 interposed therebetween, to form PMOS transistor 15. Of regions on the surface of the semiconductor substrate where n⁻ well 19 is exposed, in a prescribed region where no transistor is formed, i.e., in a prescribed field dummy region, a gate insulating film dummy pattern 29a is formed in the same layer as gate insulating film 29. On this gate insulating film dummy pattern 29a, a gate electrode dummy pattern 39a is formed in the same layer as gate electrode 39. Gate electrode dummy pattern 39a is connected with contact plug 40, as shown in FIGS. 3 and 5. Contact plug 40 is connected with ground electrode (GND) interconnection line 14. A decoupling condenser is thus formed of n⁻ well 19 including the prescribed field dummy region, gate insulating film dummy pattern 29a and gate electrode dummy pattern 39a. The decoupling condenser is connected in parallel with a primary electronic circuit.

Figure 6:
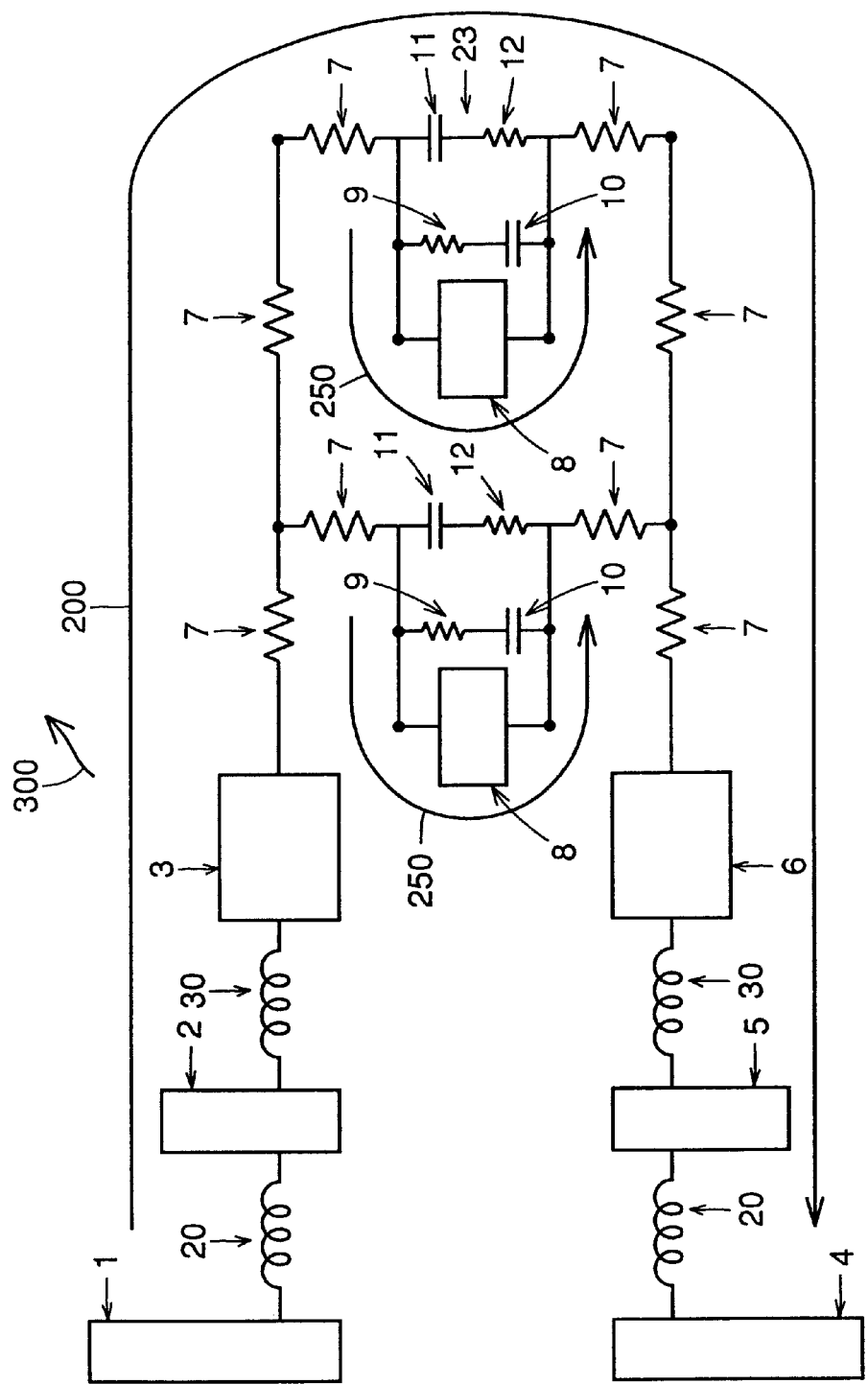
FIG. 6 is an equivalent circuit diagram of the semiconductor device according to the first embodiment of the present invention.

FIG. 6 shows an equivalent circuit diagram of the semiconductor device according to the present embodiment as described above. As shown in FIG. 6, the semiconductor device of the present embodiment has a circuit configuration with successively connected elements as follows. An external power supply electrode (Vcc) interconnection line 1 is connected to a power supply electrode (Vcc) pin 2. Power supply electrode (Vcc) pin 2 is connected to a power supply electrode (Vcc) pad 3. An external ground electrode (GND) interconnection line 4 is connected to a ground electrode (GND) pin 5. Ground electrode (GND) pin 5 is connected to a ground electrode (GND) pad 6.

Electronic circuits 8 are connected in parallel with each other between power supply electrode (Vcc) pad 3 and ground electrode (GND) pad 6. A decoupling condenser having parasitic resistances 9, 12 and parasitic capacitances 10, 11 is connected in parallel with each electronic circuit 8.

A parasitic inductance 20 of lead frame is formed between external power supply electrode (Vcc) interconnection line 1 and power supply electrode (Vcc) pin 2, and also between external ground electrode (GND) interconnection line 4 and ground electrode (GND) pin 5. A parasitic inductance of bonding wire is formed between power supply electrode (Vcc) pin 2 and power supply electrode (Vcc) pad 3, and also between ground electrode (GND) pin 5 and ground electrode (GND) pad 6. Parasitic resistances 7 are formed on interconnection lines connecting power supply electrode (Vcc) pad 3 and electronic circuits 8 and on interconnection lines connecting ground electrode (GND) pad 6 and electronic circuits 8.

With the structure as described above, in the semiconductor device according to the present embodiment, the decoupling condensers formed of p⁻ well 23 and n⁻ well 19 having prescribed field dummy regions, gate insulating film dummy patterns 21a, 29a and gate electrode dummy patterns 31a, 39a, respectively, are formed in parallel with respective electronic circuits 8 having transistors. Therefore, electronic circuit 8 having PMOS transistor 15 and NMOS transistor 16 is instantly charged with the charges stored in the decoupling condenser when a power supply potential drops or a ground potential increases due to a switching operation of a neighboring electronic circuit 8. This suppresses generation of power supply noise that would pose adverse effects on electronic circuit 8 having PMOS transistor 15 and NMOS transistor 16. Thus, malfunction of electronic circuit 8 can be prevented even when an operating voltage is set low, and therefore, it is possible to reduce the lower limit of the operating voltage of the semiconductor device.

Further, an abrupt current change in the power supplying system as shown by an arrow 200 can be enclosed within the power supply lines of respective electronic circuits 8, as shown by arrows 250. Therefore, an event where a noise generated in one electronic circuit 8 enters another electronic circuit via bonding wire connecting power supply electrode (GND) pad 3 and power supply electrode (GND) pin 2 or ground electrode (Vcc) pad 6 and ground electrode (Vcc) pin 5, or, a large current change in the power supplying system, can be suppressed. This reduces the amount of electromagnetic waves, shown by an arrow 300, emitted outwards from the semiconductor device. As a result, EMI that would be otherwise induced in the neighboring components of the semiconductor device can be suppressed.

Further still, according to the structure as described above, the decoupling condensers are formed using gate insulating film dummy patterns 21a, 29a and gate electrode dummy patterns 31a, 39a, respectively, that are utilized when carrying out CMP. Generally, gate insulating film dummy patterns 21a, 29a and gate electrode dummy patterns 31a, 39a are disposed thoroughly on the semiconductor substrate in regions where no gate electrodes 21, 31 are formed, so as to planarize the surface of the interlayer insulating film in the CMP process. Therefore, it is possible to form the decoupling condensers without having to occupy special regions on the semiconductor substrate dedicated thereto. As a result, malfunction under a low voltage as well as the EMI can be prevented while reducing the area occupied by the semiconductor device.

In addition, according to the semiconductor device of the present embodiment, the element forming regions in which PMOS transistor 15 and NMOS transistor 16 are to be formed and a prescribed field dummy region in which one electrode of the decoupling condenser is to be formed are formed within a single well, n⁻ well 19 or p⁻ well 23. Thus, two connections, i.e., connection between the one electrode of the decoupling condenser and the ground or power supply electrode, and connection between the ground or power supply electrode and the well for the purpose of fixing the potential to stabilize the operation of the transistors, can be realized simply by connecting one contact plug to one impurity region, or more specifically, by connecting contact plug 45 to n⁻ well 19, or by connecting contact plug 40 to p⁻ well 23. As a result, in the proximity of the decoupling condenser within p⁻ well 23, there is no need to form a power supply electrode interconnection line. It is only necessary to form ground electrode (GND) interconnection line 14 to be connected with gate electrode dummy pattern 31a constituting the decoupling condenser. Likewise, in the proximity of the decoupling condenser within n⁻ well 19, there is no need to form a ground electrode interconnection line. It is only necessary to form power supply electrode (Vcc) interconnection line 13 to be connected to gate electrode dummy pattern 39a constituting the decoupling condenser. This increases the degree of freedom in layout design. As a result, it is possible to reduce the layout area of the semiconductor device.

Second Embodiment

Figure 7:
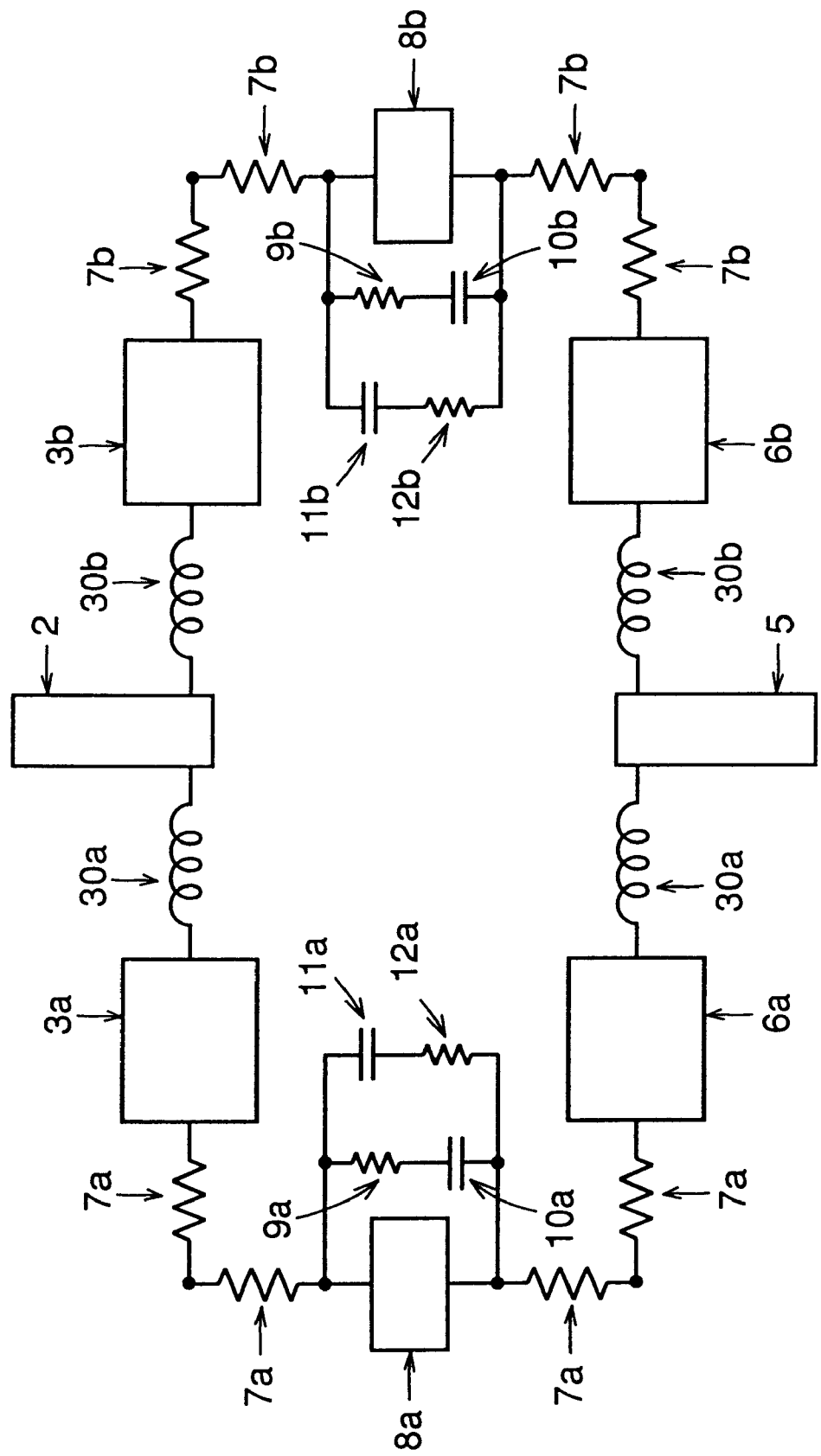
FIG. 7 is an equivalent circuit diagram of a semiconductor device according to a second embodiment of the present invention.

Now, the semiconductor device according to the second embodiment of the present invention will be described with reference to FIGS. 7 to 12. The structure of the semiconductor device according to the present embodiment is similar to that of the first embodiment in that a decoupling condenser, formed of dummy patterns of the gate insulating film and the gate electrode that are formed on a prescribed field dummy region in the impurity region for use in the CMP process, is disposed in parallel with a primary electronic circuit. An equivalent circuit diagram of the semiconductor device according to the present embodiment is shown in FIG. 7. As seen from FIG. 7, the semiconductor device of the present embodiment has a circuit configuration in which elements are successively connected as follows.

An external power supply electrode (Vcc) interconnection line (not shown) is connected to a power supply electrode (Vcc) pin 2. Power supply electrode (Vcc) pin 2 is connected to power supply electrode (Vcc) pads 3a and 3b. An external ground electrode (GND) interconnection line (not shown) is connected to a ground electrode (GND) pin 5. Ground electrode (GND) pin 5 is connected to ground electrode (GND) pads 6a and 6b. An electronic circuit 8a and an analog circuit 8b are connected between power supply electrode (Vcc) pads 3a, 3b and ground electrode (GND) pads 6a, 3b, respectively.

A parasitic inductance of lead frame is formed between the external power supply electrode (Vcc) interconnection line and power supply electrode (Vcc) pin 2, and also between the external ground electrode (GND) interconnection line and ground electrode (GND) pin 5. Parasitic inductances 30a, 30b of bonding wire are formed between power supply electrode (Vcc) pin 2 and power supply electrode (Vcc) pads 3a and 3b, and between ground electrode (GND) pin 5 and ground electrode (GND) pads 6a, 6b, respectively. Parasitic resistances 7a and 7b are formed on interconnection lines connecting power supply electrode (Vcc) pads 3a and 3b with electronic circuit 8a and analog circuit 8b, respectively, and on interconnection lines connecting ground electrode (GND) pads 6a and 6b with electronic circuit 8a and analog circuit 8b, respectively.

Figure 8:
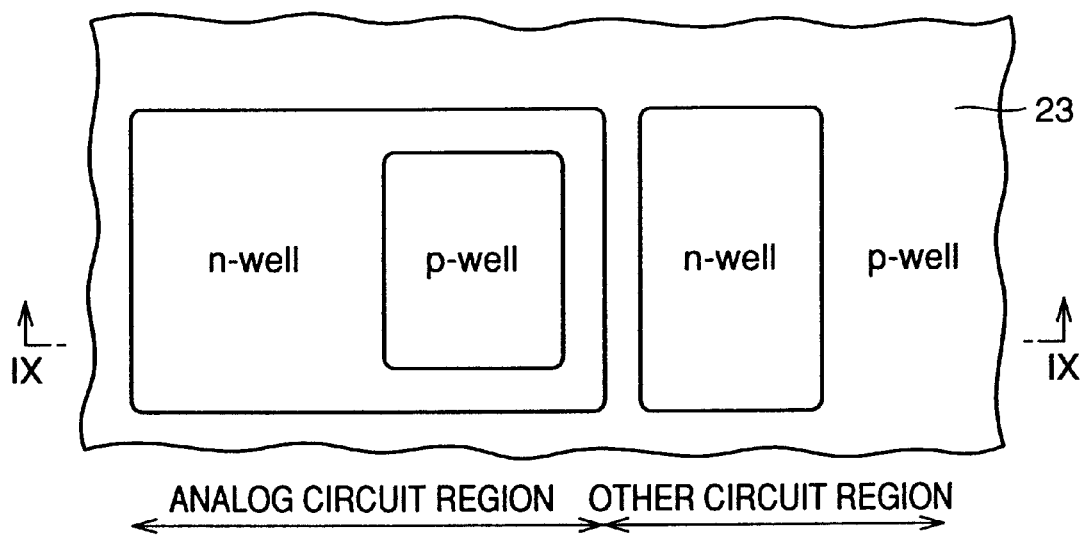
FIG. 8 is a diagram schematically showing an example of a planar structure of well separation in the semiconductor device according to the second embodiment of the present invention.
Figure 9:
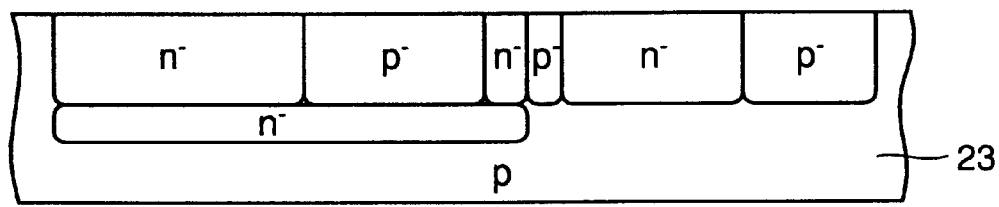
FIG. 9 is a cross sectional view taken along the line IX—IX in FIG. 8.
Figure 10:
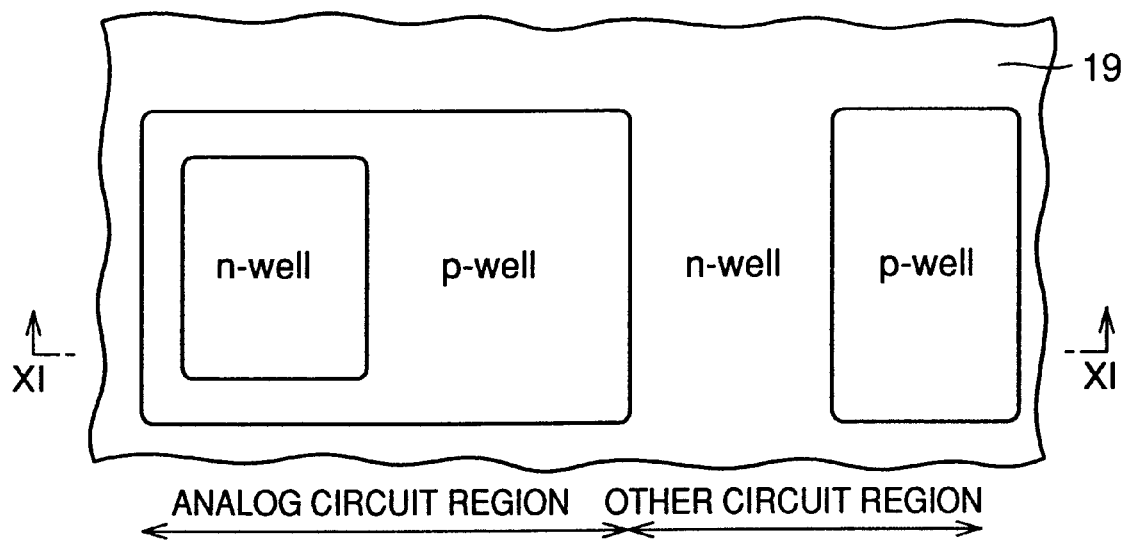
FIG. 10 is a diagram schematically showing another example of the planar structure of well separation in the semiconductor device according to the second embodiment of the present invention.
Figure 11:
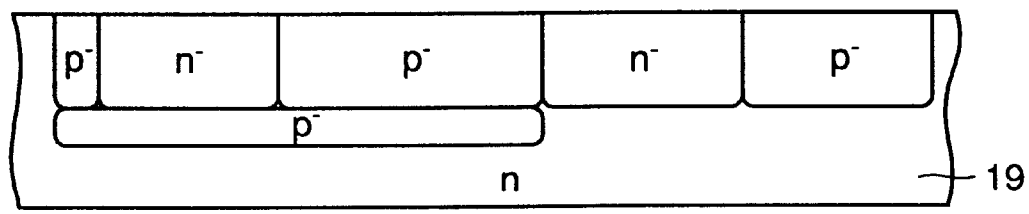
FIG. 11 is a cross sectional view taken along the line XI—XI in FIG. 10.

FIG. 8 is a top plan view of an example of a well separating structure for analog circuit 8b and electronic circuit 8a formed on a p type semiconductor substrate. FIG. 9 is a cross sectional view of the structure, taken along the line IX—IX in FIG. 8. FIG. 10 is a top plan view of another example of the well separating structure for analog circuit 8b and electronic circuit 8a formed on an n type semiconductor substrate. FIG. 11 is a cross sectional view of the structure, taken along the line XI—XI in FIG. 11.

Figure 12:
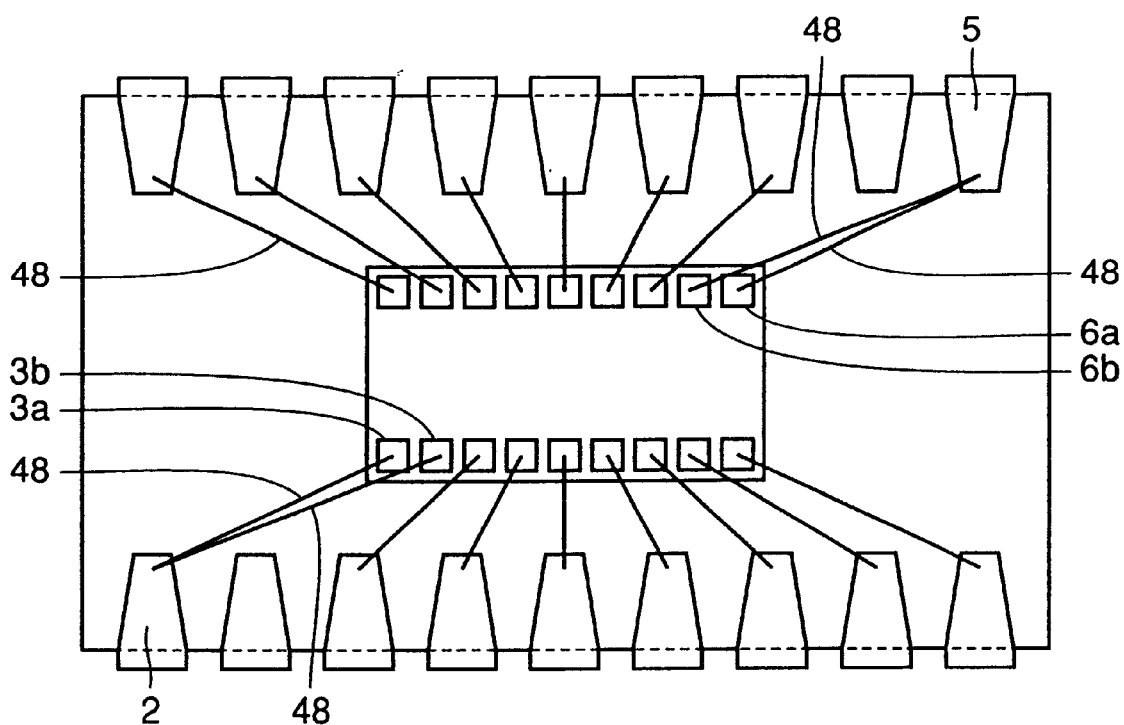
FIG. 12 is a diagram illustrating connection among a power supply electrode (Vcc) pin, a ground electrode (GND) pin, bonding wire, a power supply electrode (Vcc) pad, a ground electrode (GND) pad and lead frame in the semiconductor device according to the second embodiment of the present invention.

FIG. 12 shows a structure within the package. Power supply electrode (Vcc) pin 2 and power supply electrode (Vcc) pad 3b of analog circuit 8b are connected via bonding wire 48, and power supply electrode (Vcc) pin 2 and power supply electrode (Vcc) pad 3a of electronic circuit 8a are connected via bonding wire 48. Likewise, ground electrode (GND) pin 5 and ground electrode (GND) pad 6a of electronic circuit 8a are connected by bonding wire 48, and ground electrode (GND) pin 5 and ground electrode (GND) pad 6b of analog circuit 8b are connected by bonding wire 48.

With the structure as described above, electronic circuit 8a, e.g., a digital circuit, and analog circuit 8b, e.g., a sense amplifier or a memory cell, are separated from each other in parallel, from power supply electrode (Vcc) pads 3a, 3b to ground electrode (GND) pads 6a, 6b. Therefore, when the power supply potential drops or the ground potential increases, noise is transmitted both ways between electronic circuit 8a and analog circuit 8b, via parasitic inductances 30a, 30b of bonding wire 48 connecting power supply electrode (Vcc) pads 3a, 3b and power supply electrode (Vcc) pin 2, and via parasitic inductances 30a, 30b of bonding wire 48 connecting ground electrode (GND) pads 6a, 6b and ground electrode (GND) pin 5.

The parasitic inductances 30a, 30b of bonding wire suppress an abrupt current change. Thus, transmission of the noise generated in electronic circuit 8a to analog circuit 8b, in which such a noise would usually cause malfunction, is prevented. In other words, the noise is enclosed within electronic circuit 8a more effectively. As a result, the malfunction of analog circuit 8b due to the noise generated in electronic circuit 8a can be prevented more reliably.

Third Embodiment

Figure 13:
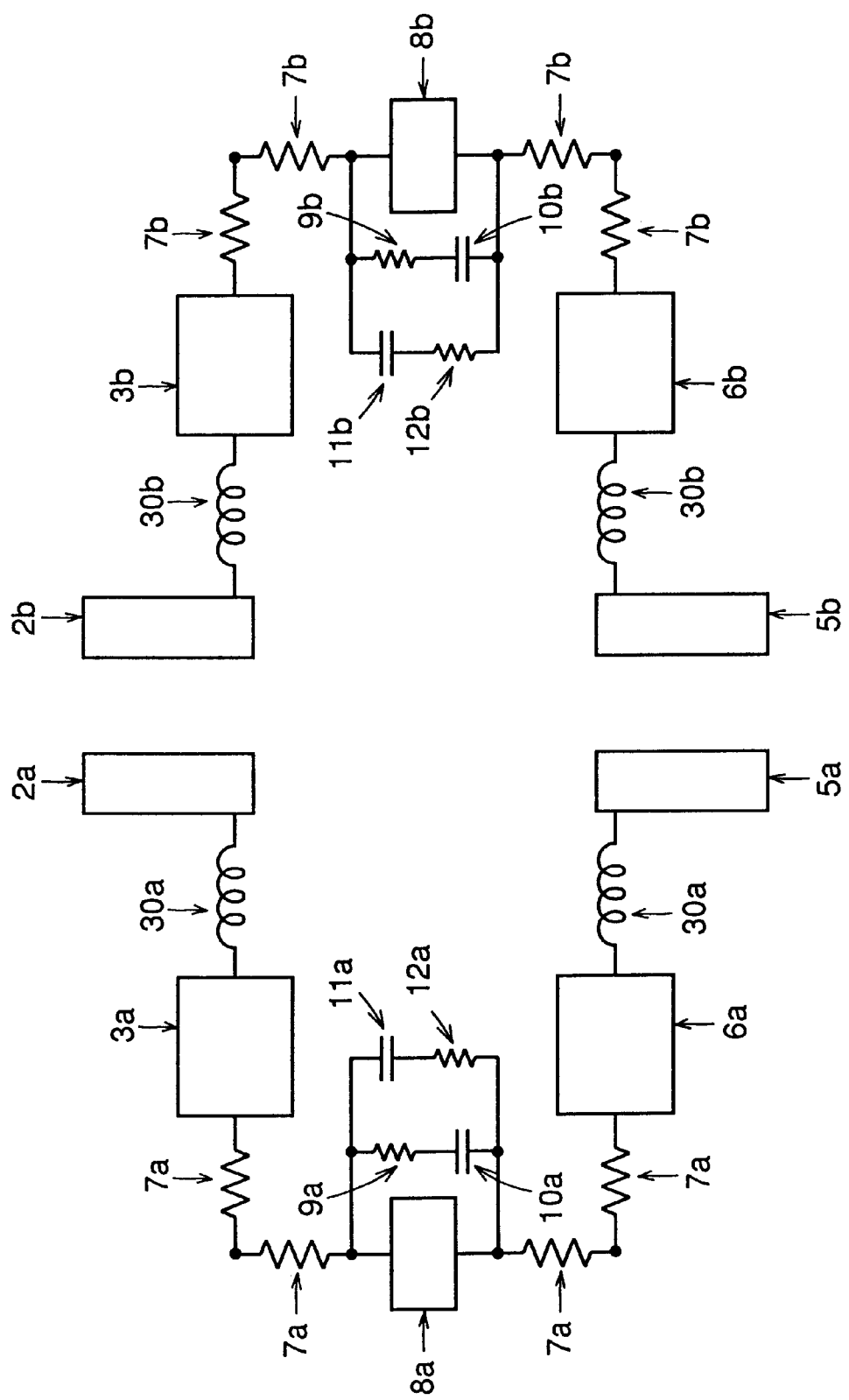
FIG. 13 is an equivalent circuit diagram of a semiconductor device according to a third embodiment of the present invention.

Now, the semiconductor device according to the third embodiment of the present invention will be described with reference to FIGS. 13 to 15. The structure of the semiconductor device according to the present embodiment is similar to those of the first and second embodiments in that a decoupling condenser, formed of dummy patterns of the gate insulating film and the gate electrode that are formed on a prescribed field dummy region in the impurity region for use in the CMP process, is disposed in parallel with a primary electronic circuit. FIG. 13 is an equivalent circuit diagram of the semiconductor device of the present embodiment. As seen from FIG. 13, the semiconductor device according to the present embodiment has a circuit configuration with successively connected elements as follows.

An external power supply electrode (Vcc) interconnection line (not shown) is connected to respective power supply electrode (Vcc) pins 2a and 2b. Power supply electrode (Vcc) pins 2a and 2b are connected to power supply electrode (Vcc) pads 3a and 3b, respectively. An external ground electrode (GND) interconnection line (not shown) is connected to respective ground electrode (GND) pins 5a and 5b. Ground electrode (GND) pins 5a and 5b are connected to ground electrode (GND) pads 6a and 3b, respectively. An electronic circuit 8a and an analog circuit 8b are connected between power supply electrode (Vcc) pads 3a, 3b and ground electrode (GND) pads 6a, 6b, respectively. Parasitic inductances of lead frame are formed between the external power supply electrode (Vcc) interconnection line and power supply electrode (Vcc) pins 2a, 2b, and also between the external ground electrode (GND) interconnection line and ground electrode (GND) pins 5a, 5b.

Parasitic inductances 30a, 30b of bonding wire are formed between power supply electrode (Vcc) pins 2a, 2b and power supply electrode (Vcc) pads 3a, 3b, respectively, and also between ground electrode (GND) pins 5a, 5b and ground electrode (GND) pads 6a, 6b, respectively. Parasitic resistances 7a, 7b are formed on interconnection lines connecting power supply electrode (Vcc) pads 3a, 3b and electronic circuit 8a and analog circuit 8b, respectively, and on interconnection lines connecting ground electrode (GND) pads 6a, 6b and electronic circuit 8a and analog circuit 8b, respectively.

Figure 14:
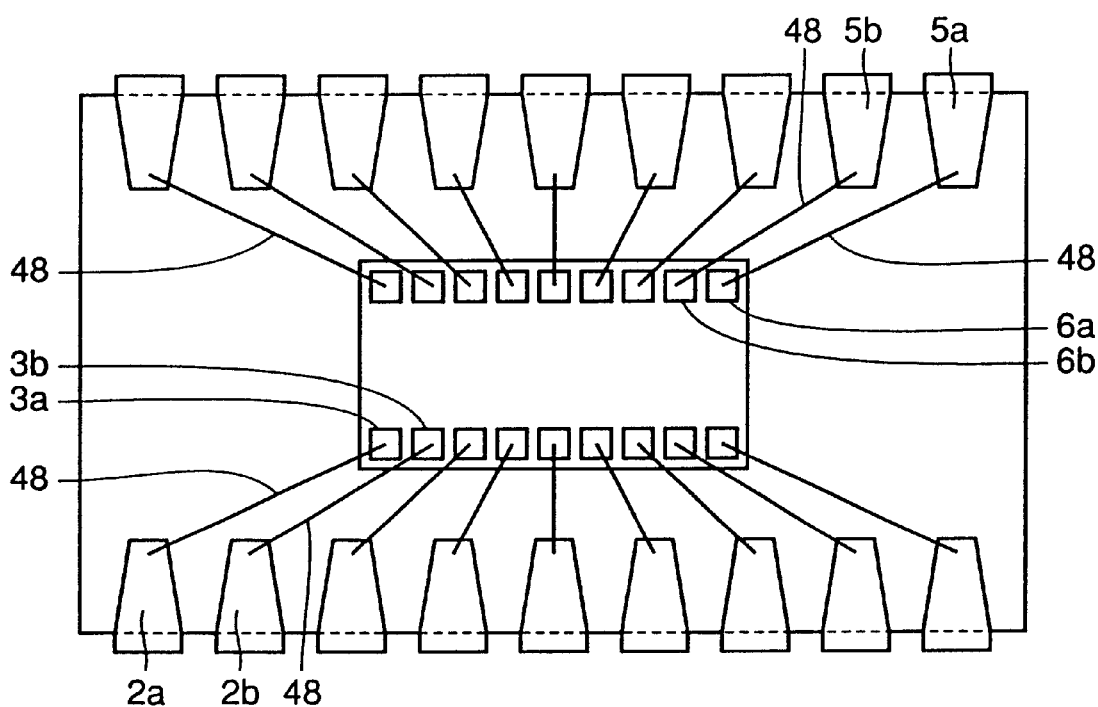
FIG. 14 is a diagram illustrating connection among the power supply electrode (Vcc) pin, the ground electrode (GND) pin, the bonding wire, the power supply electrode (Vcc) pad, the ground electrode (GND) pad and the lead frame in the semiconductor device according to the third embodiment of the present invention.
Figure 15:
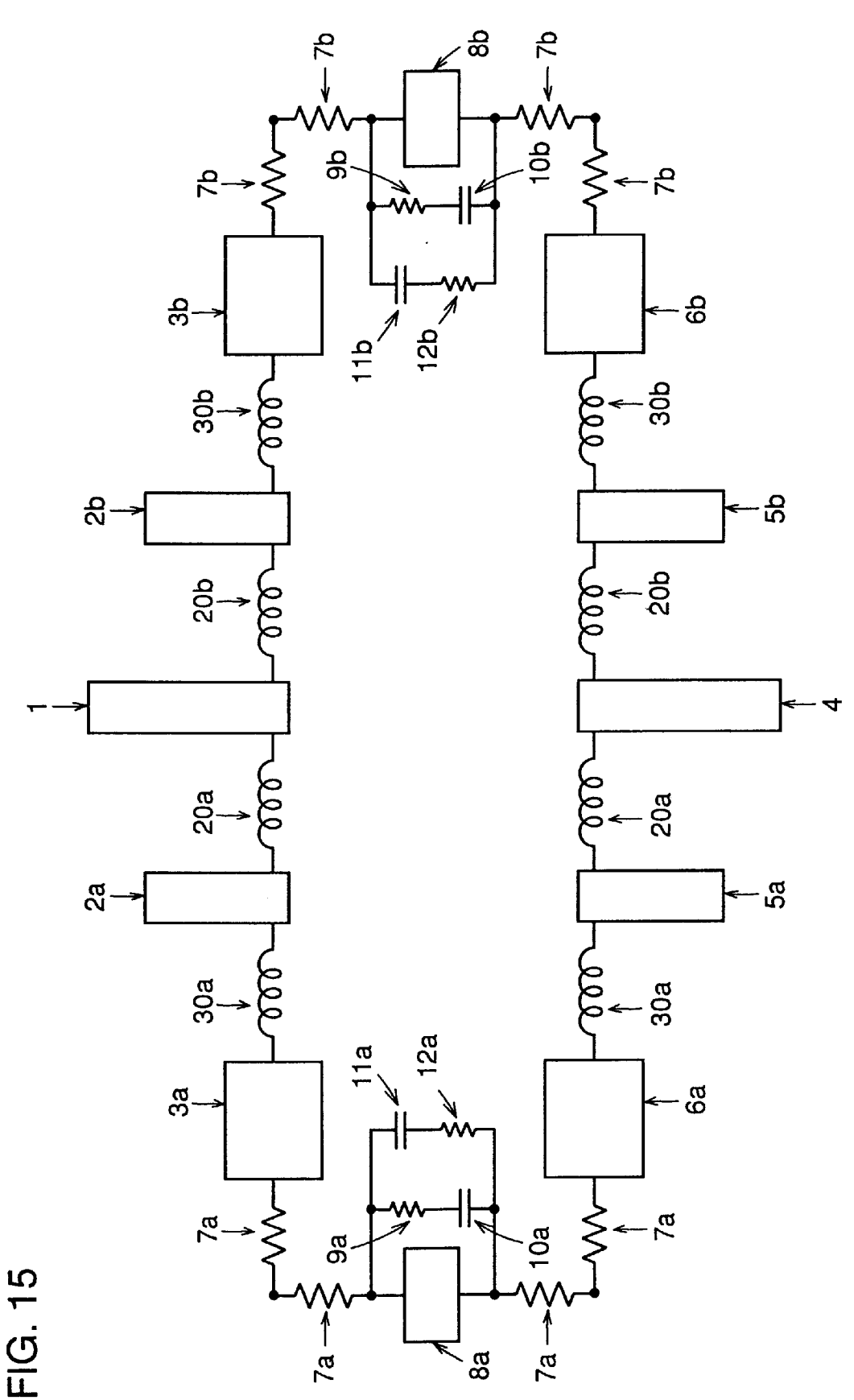
FIG. 15 is an equivalent circuit diagram illustrating the semiconductor device according to the third embodiment of the present invention in the case where it is short-circuited outside the package.
Figure 16:
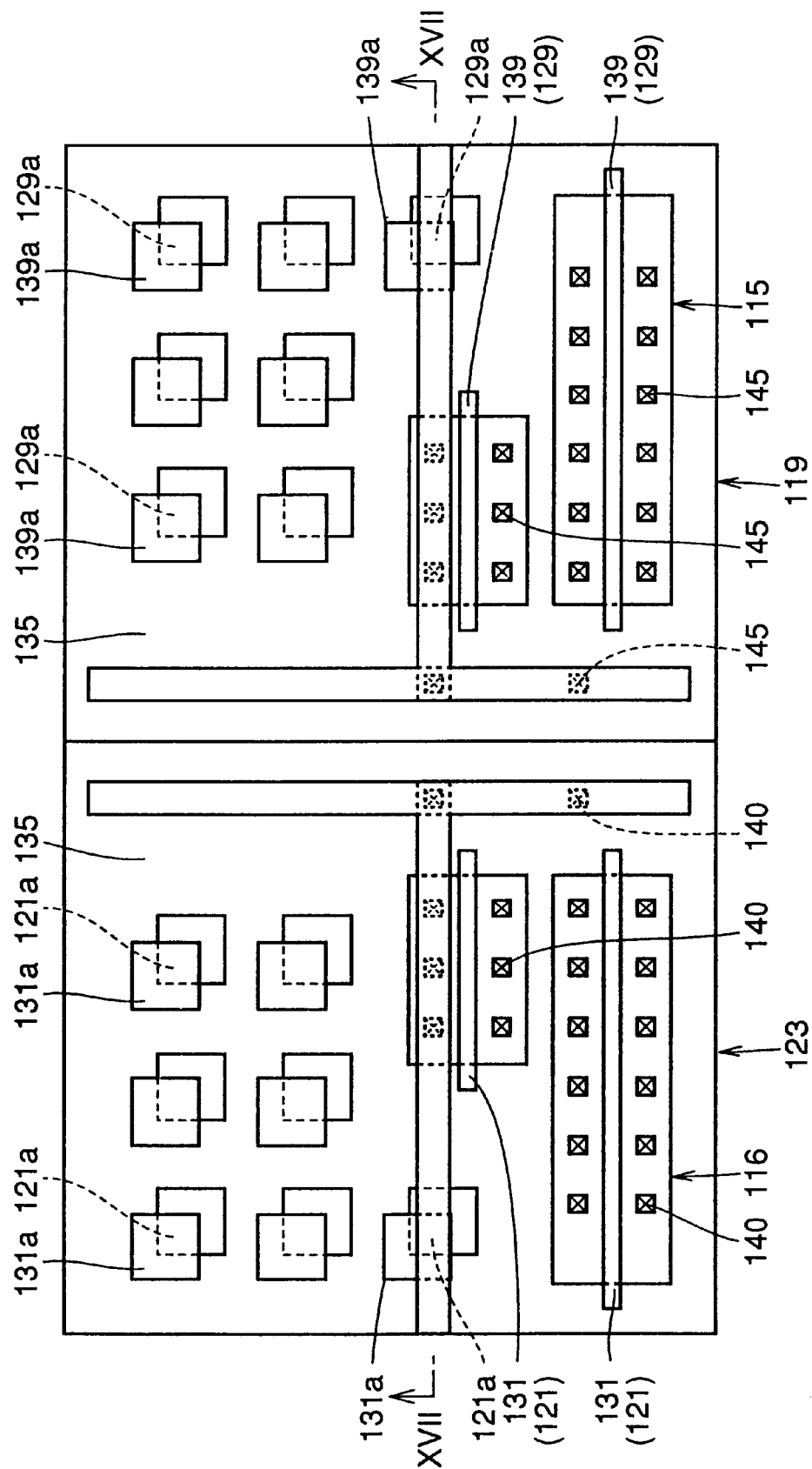
FIG. 16 is a diagram schematically showing an example of a planar structure of a conventional semiconductor device.
Figure 17:
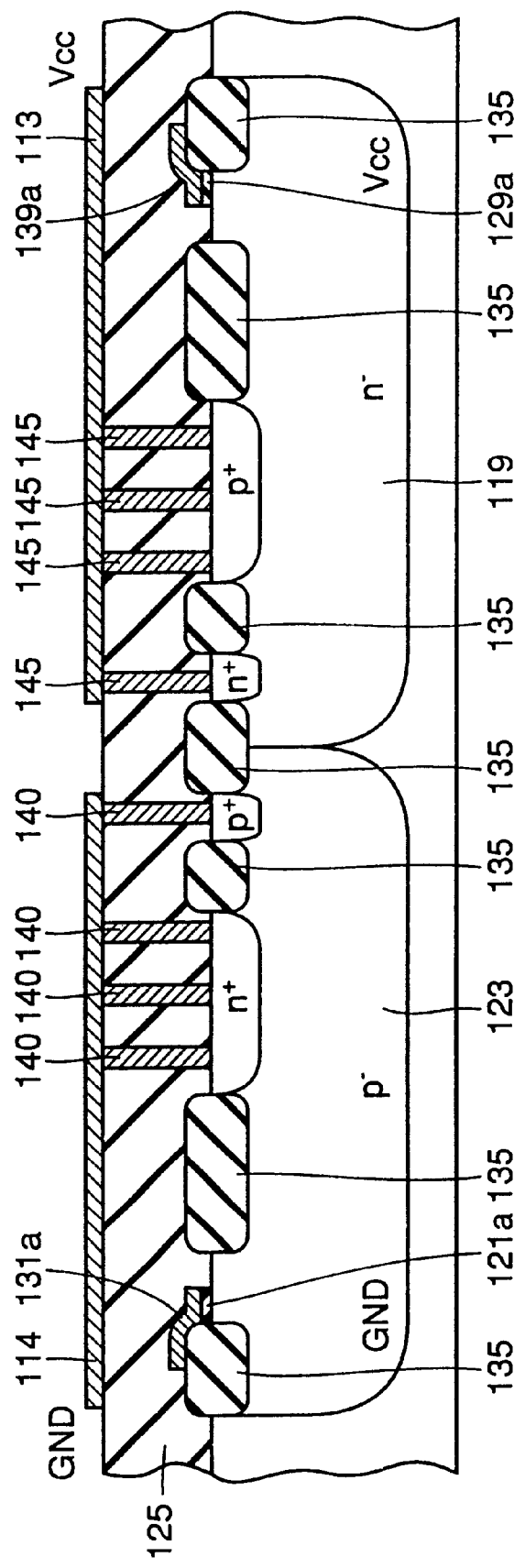
FIG. 17 is a cross sectional view taken along the line XVII—XVII in FIG. 16.
Figure 18:
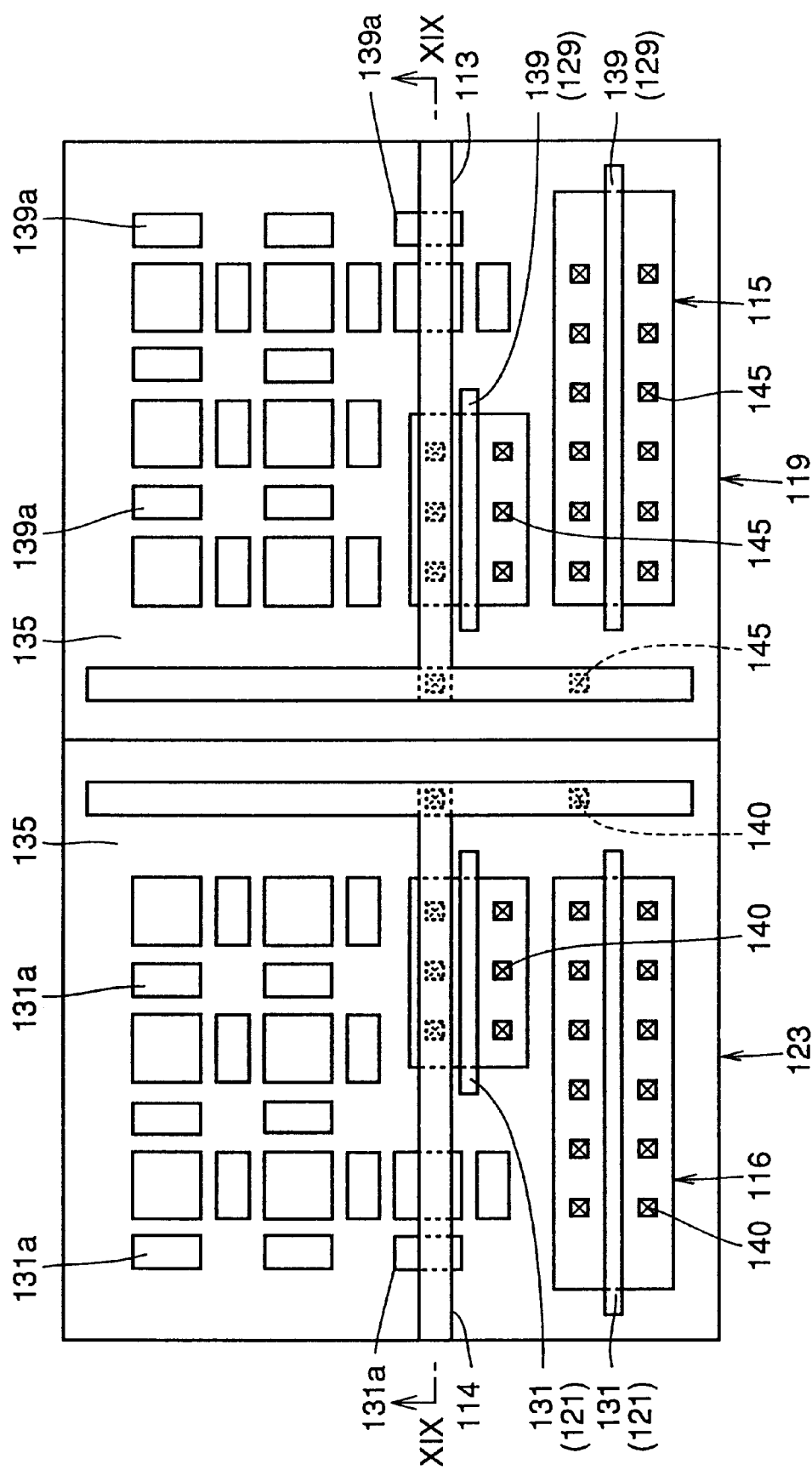
FIG. 18 is a diagram schematically showing an example of a planar structure of a conventional semiconductor device.
Figure 19:
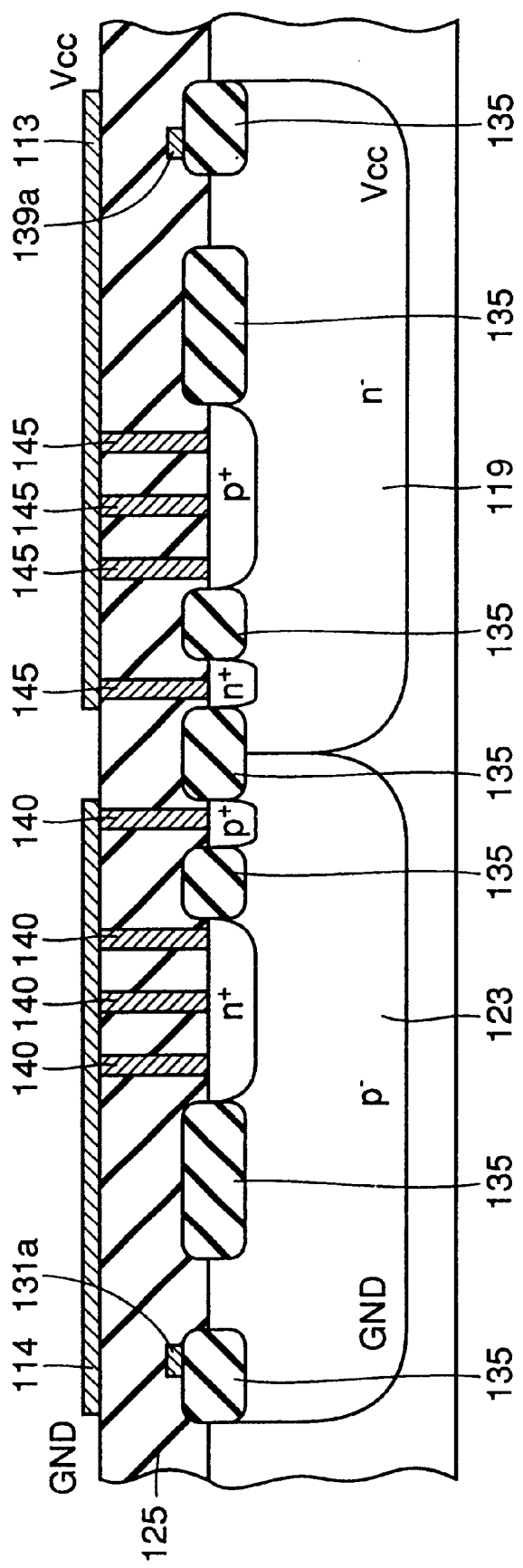
FIG. 19 is a cross sectional view taken along the line XIX—XIX in FIG. 18.
Figure 20:
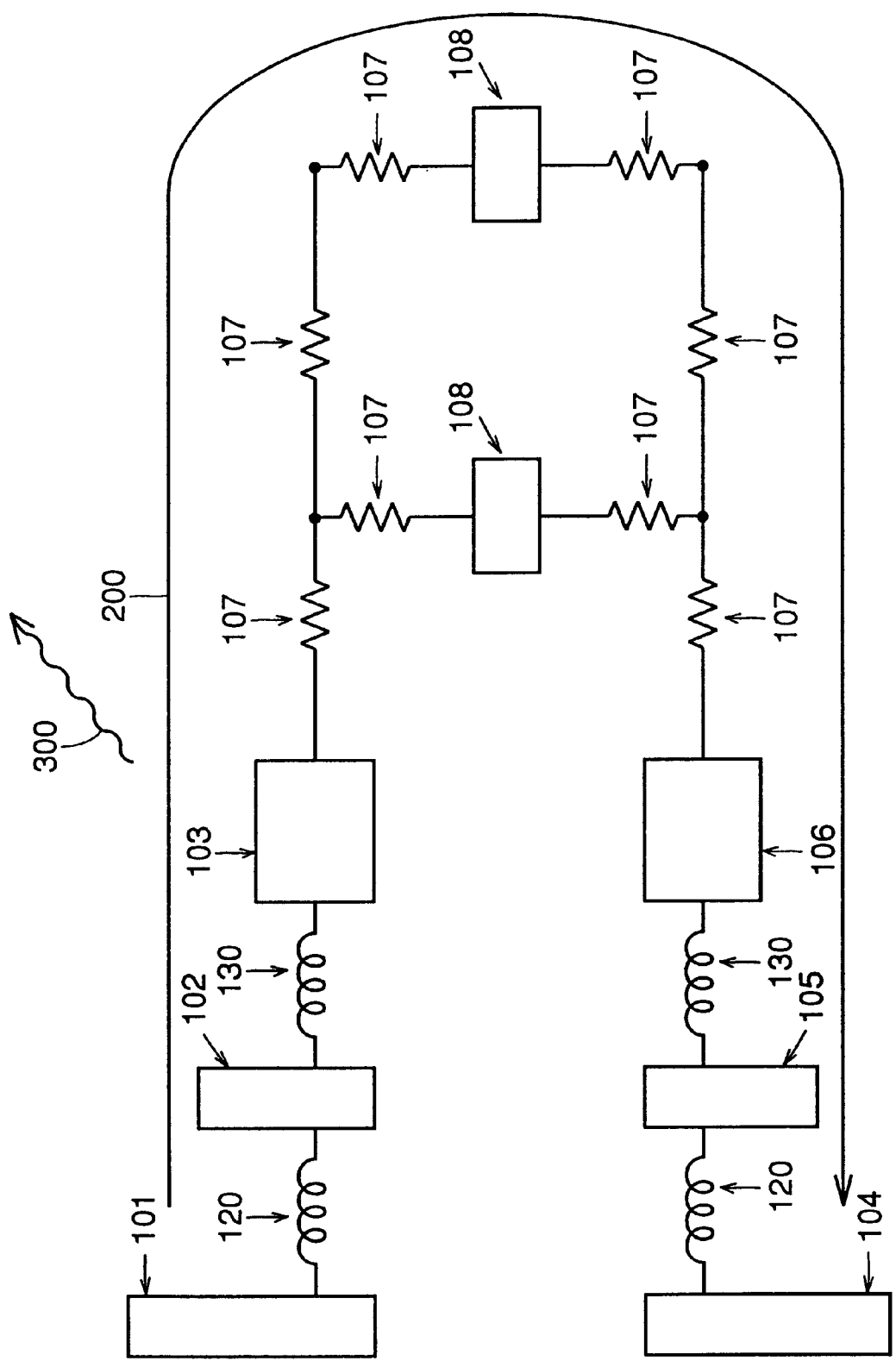
FIG. 20 is an equivalent circuit diagram of a conventional semiconductor device.

FIG. 14 shows the structure within the package. As shown in FIG. 14, power supply electrode (Vcc) pin 2a and power supply electrode (Vcc) pad 3a of electronic circuit 8a are connected to each other by bonding wire 48. Power supply electrode (Vcc) pin 2b and power supply electrode (Vcc) pad 3b of analog circuit 8b are connected to each other by bonding wire 48. Ground electrode (GND) pin 5a and ground electrode (GND) pad 6a of electronic circuit 8a are connected to each other by bonding wire 48. Ground electrode (GND) pin 5b and ground electrode (GND) pad 6b of analog circuit 8b are connected to each other by bonding wire 48.

Assume that the equivalent circuit shown in FIG. 13 develops a short circuit outside the package. In this case, as shown in FIG. 15, external power supply electrode (Vcc) interconnection line 1 is connected to power supply electrode (Vcc) pins 2a and 2b via parasitic inductances 20a and 20b of lead frame, respectively. Likewise, external ground electrode (GND) interconnection line 4 is connected to ground electrode (GND) pins 5a and 5b via parasitic inductances 20a and 20b of lead frame, respectively.

With the structure as described above, electronic circuit 8a, e.g., a digital circuit, and analog circuit 8b, e.g., a sense amplifier or a memory cell, are separated from each other in parallel, from power supply electrode (Vcc) pins 2a, 2b to ground electrode (GND) pins 5a, 5b. Thus, there exist parasitic inductances 30a, 30b of bonding wire between power supply electrode (Vcc) pads 3a, 3b and power supply electrode (Vcc) pins 2a, 2b of electronic circuit 8a and analog circuit 8b, respectively, and also between ground electrode (GND) pads 6a, 6b and ground electrode (GND) pins 5a, 5b of electronic circuit 8a and analog circuit 8b, respectively. Further, there exist parasitic inductances 20a, 20b of lead frame outside of power supply electrode (Vcc) pins 2a, 2b and also outside of pound electrode (GND) pins 5a, 5b, respectively. As a result, enclosure of the noise can further be guaranteed. In other words, when the power supply potential drops or the ground potential rises, the noise generated in electronic circuit 8a can be prevented from being transmitted to analog circuit 8b with additional reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having an electronic circuit and a decoupling condenser provided in parallel with each other between a power supply electrode and a ground electrode, the electronic circuit including a transistor, said decoupling condenser including an impurity region formed below a main surface of a semiconductor substrate with a prescribed depth, a dummy gate insulating film located on said impurity region, formed in a same layer as a gate insulating film of said transistor, and a dummy gate electrode located on said dummy gate insulating film, formed in a same layer as a gate electrode of said transistor.

2. The semiconductor device according to claim 1, wherein said impurity region includes an element forming region isolated by an element isolating region and a field dummy region being a dummy pattern of the element forming region, and a semiconductor element is formed in said element forming region, and said dummy gate insulating film and said dummy gate electrode are formed in said field dummy region.

3. The semiconductor device according to claim 1, wherein said impurity region is a p type impurity region electrically connected to said ground electrode, and said dummy gate electrode is electrically connected to said power supply electrode.

4. The semiconductor device according to claim 1, wherein said impurity region is an n type impurity region electrically connected to said power supply electrode, and said dummy gate electrode is electrically connected to said ground electrode.

5. The semiconductor device according to claim 1, wherein said ground electrode includes a first ground electrode pad connected to a prescribed analog circuit and a second ground electrode pad connected to an electronic circuit other than said prescribed analog circuit, and said power supply electrode includes a first power supply electrode pad connected to said prescribed analog circuit and a second power supply electrode pad connected to said electronic circuit other than said prescribed analog circuit.

6. The semiconductor device according to claim 5, wherein said ground electrode includes a first ground electrode pin connected to said first ground electrode pad and a second ground electrode pin connected to said second ground electrode pad, and said power supply electrode includes a first power supply electrode pin connected to said first power supply electrode pad and a second power supply electrode pin connected to said second power supply electrode pad.

* * * * *